United States Patent [19]

Schwartz

[11] 4,159,537
[45] Jun. 26, 1979

[54] BUBBLE DETECTOR-DYNAMIC LEVEL SIGNAL SHIFTING

[75] Inventor: Sidney J. Schwartz, Vista, Calif.

[73] Assignee: Burroughs Corporation, Detroit, Mich.

[21] Appl. No.: 901,577

[22] Filed: May 1, 1978

[51] Int. Cl.² ............................................. G11C 7/06
[52] U.S. Cl. ....................................................... 365/8
[58] Field of Search ........................ 365/7, 8, 189, 209

[56] References Cited

U.S. PATENT DOCUMENTS 3,813,660  5/1974  Buhrer ..................................... 365/8

*Primary Examiner*—James W. Moffitt
*Attorney, Agent, or Firm*—Joseph R. Dwyer; Mervyn L. Young; Kevin R. Peterson

[57] ABSTRACT

In a bubble memory system having a detector device for sensing the presence or absence of magnetic bubbles in a bubble stream and producing an output signal accordingly which is sensed by a differential sense amplifier having a clamp circuit to select the voltage level with which the signal is to be compared at a sampling time and a strobe circuit for sampling the signal at the preselected time, a dynamic input signal offset for enhancing the signal-to-noise factor at the input to the sense amplifier so that a signal representing an absence of a bubble is clearly distinguishable over a bubble presence signal. This invention disclosed is disclosed as operable with a dφ/dt or magnetoresistive bridge type detectors and comprises means for shifting the signal level negatively by providing a negative going pulse just after the time the clamp circuit is released and while the signal is being sampled. In one embodiment of this invention, the negative going pulse is applied inductively and in another embodiment the negative going pulse is applied capacitively. The point of implementation of the dynamic input signal may be either within the bubble device itself or contained in a circuit board to which both the bubble device and sense amplifier interfaces.

8 Claims, 6 Drawing Figures

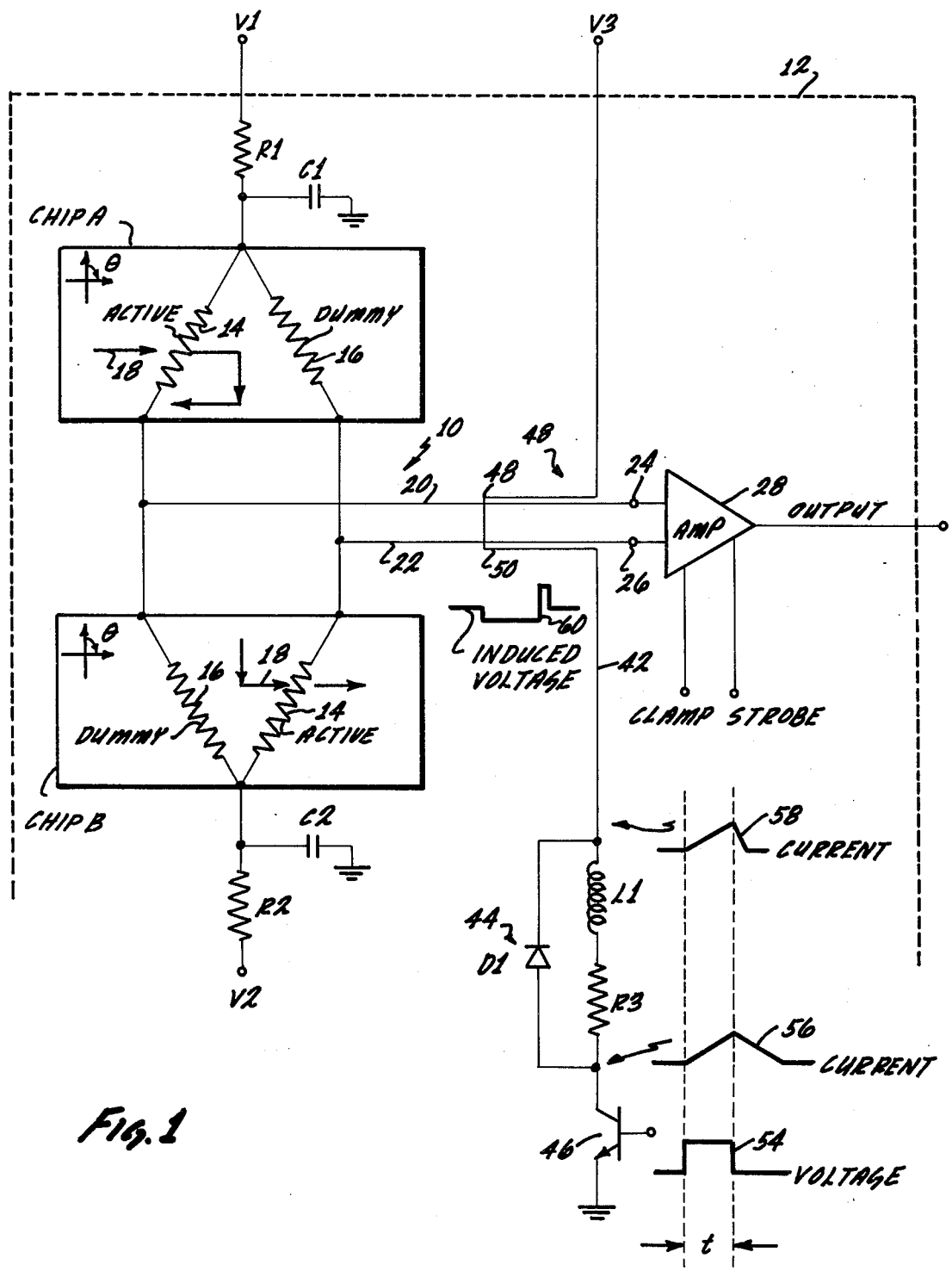

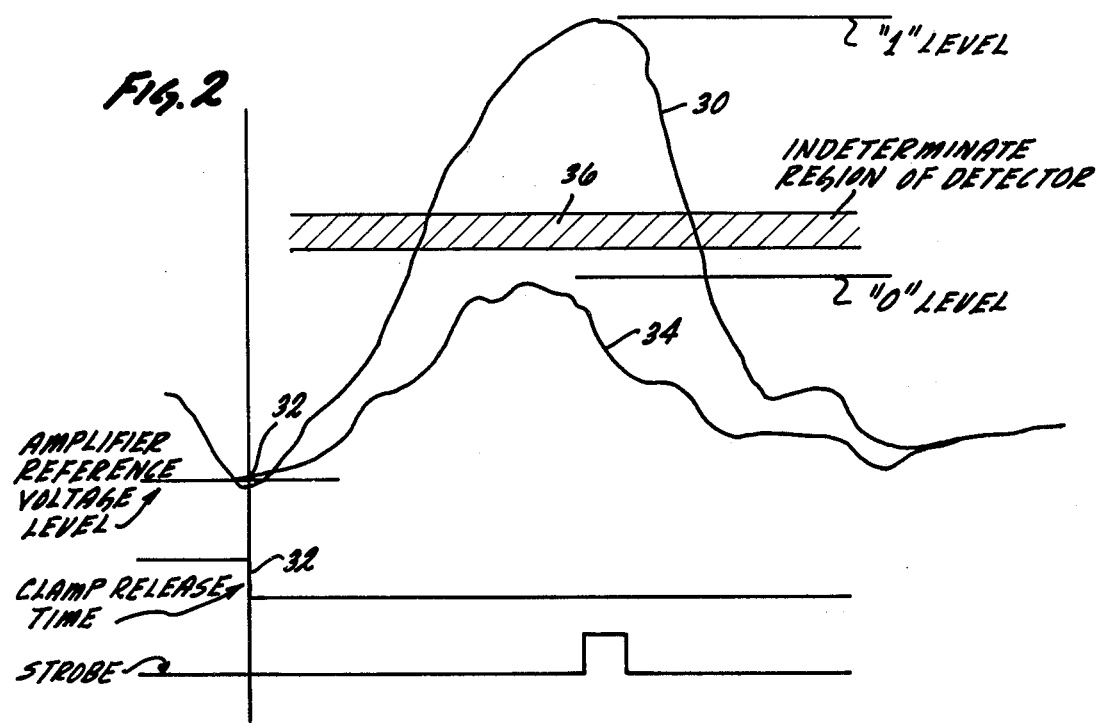
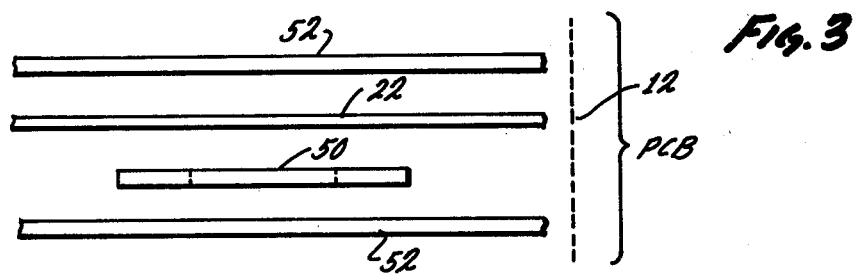
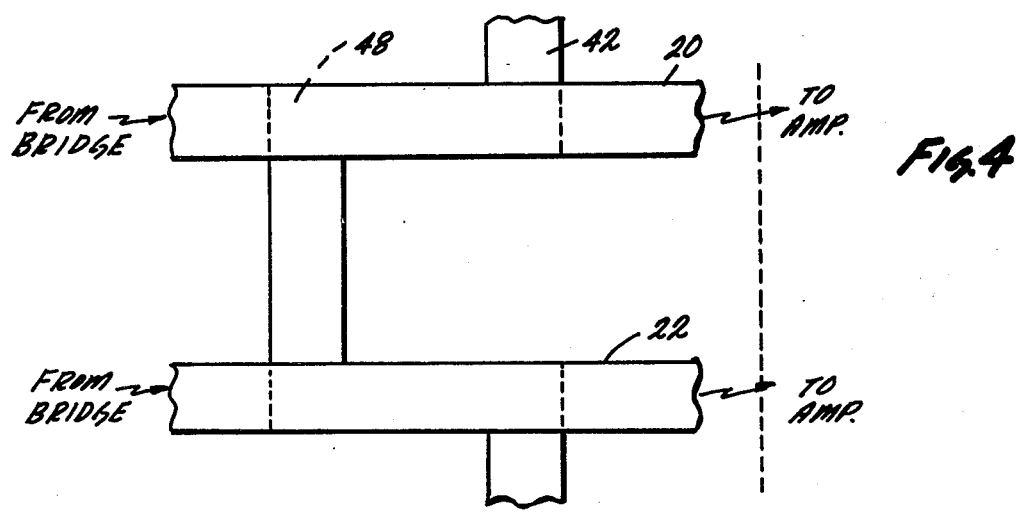

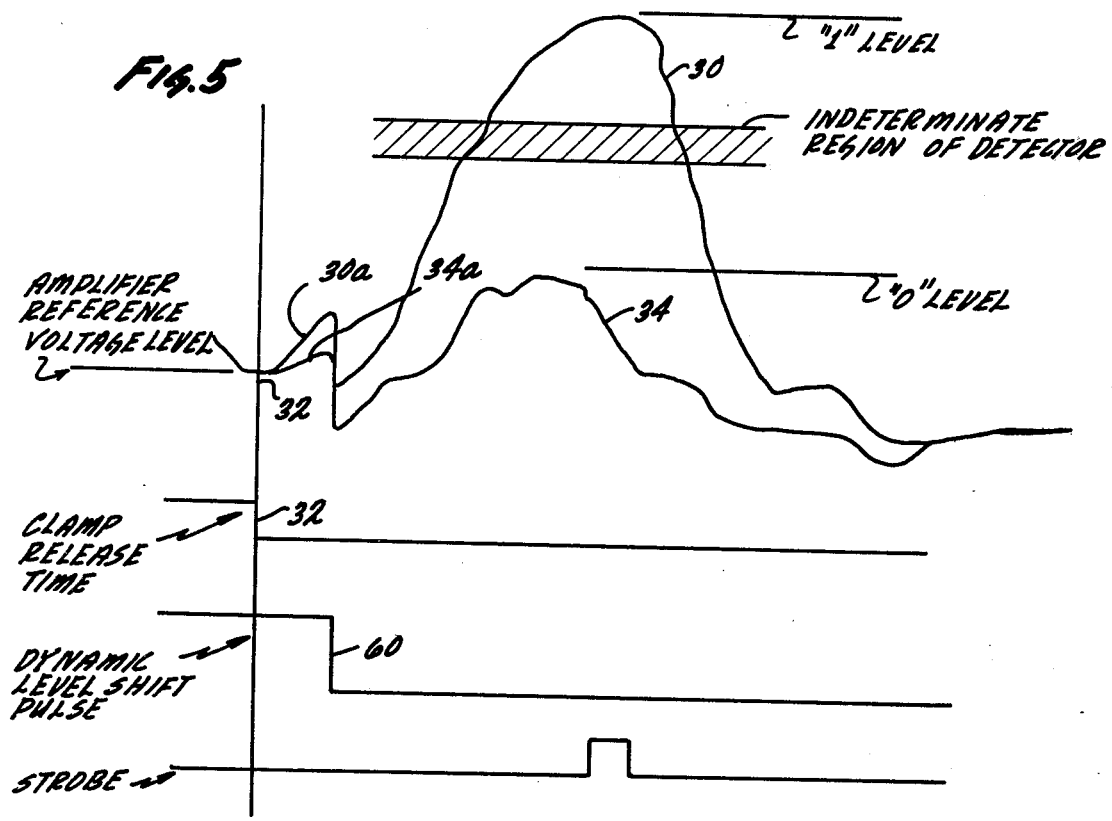

BUBBLE DETECTOR-DYNAMIC LEVEL SIGNAL SHIFTING

BACKGROUND OF THE INVENTION

This invention relates to magnetic bubble (domain) memories and relates in particular to an improved means for enhancing the detection of bubbles or the absence thereof in a detector used in a bubble memory device. More specifically, this invention relates to a means of enhancing the signal generated by such detector so that a signal representing the absence of a bubble in the detector is clearly distinguishable over a bubble presence signal in the detector.

This invention as disclosed in connection with a magnetoresistive bridge type detector in which the absence or presence of a magnetic bubble is determined by a change in resistance in the magnetoresistive material that is producing an output signal accordingly, but this invention will operate equally satisfactory with any type of bubble detector which produces an output signal to be sensed by a differential sense amplifier of the type having a clamp circuit to select the voltage level with which the signal is to be compared at a sampling time and a strobe circuit for sampling the signal at the preselected time.

There are numerous examples of magnetoresistivedetectors in bubble memory chips which rely on a change of resistance of the magnetoresistive material, such as Permalloy, to detect the presence or absence of a bubble propagated thereunder by a rotating in-plane magnetic field and to generate a signal which is sensed by a readout device, usually a differential amplifier, such as the Motorola differential amplifier MC 1544L/1444L. Such detector devices are often arranged in a bridge network in which one magnetoresistive detectors thereof comprises an active detector and another leg thereof comprises a dummy detector; the former being the detector under which bubbles are propagated and the other detector, while subject to the same in-plane rotating propagating field, is out of the bubble path and is for the purpose of providing a noise signal approximately the same in amplitude, frequency and phase as the signal representing the absence of a bubble in the active leg of the detector. The other two legs of the bridge network may be either balancing resistors or active and dummy detectors of other chips so that the current through each leg of the bridge is the same. A typical example of bridge networks using magnetoresistive devices is shown in the U.S. Pat. No. 3,833,858 to Lienhard et al. and in the U.S. Pat. No. 3,953,840 to Cutler et al.

In the foregoing prior art, and especially in the patent to Cutler et al., the signal from the bridge network is sensed by a sensing circuitry which includes a clamp circuit to select the voltage level with which the signal is to be compared, a differential amplifier, and a strobe circuit to sample the signal at preselected times; all of which are means to rid the desired output signal generated by the bubble of noise, whatever the source.

The aforementioned Motorola sense amplifier is used often in bubble memories and is said to have been "originally designed especially for plated wire memories" by Michaelis and Bonyhard in their article entitled, "Magnetic Bubble Mass Memory - - - Module Design and Operation," IEEE *Transactions on Magnetics* Vol. MAG 9 No. 3, Sept. 1973, Pages 436–441. This sense amplifier includes a clamp circuit (capacitor restore) to set the voltage level at which the signal is to be compared and a strobe circuit to sample the signal at selected time. However, whether the signal processing circuitry of the Cutler et al patent, or the Motorola differential amplifier, supra, is used, the problem is distinguishing a binary "0" signal (ie, the absence of a bubble in the detector, utilizing positive logic) over circuit noise which may be high enough to cause the output signal to be erroneously interpreted as a binary "1" signal. This difficulty is not overcome by increasing the gain of the amplifier since this only serves to increase the noise level also.

Accordingly, it is an object of this invention to improve magnetic bubble memory detection devices by enhancing the output signal therefrom so that the absence or presence of a bubble in the sensor is clearly distinguishable.

A more specific object of this invention is to provide a dynamic offset signal in the signal processing circuitry between the output signal from the detector and the input to the differential sense amplifier so that the sense amplifier can clearly distinguish the signal representing the absence of a bubble from a signal representing the presence of a bubble in the detector.

Still, a more specific object of this invention is to provide a means for enhancing the signal at the input to the differential sense amplifier by lowering the noise level with a negative going pulse so that the sense amplifier, which is unresponsive to a negative signal, can clearly distinguish a binary "0" (bubble absence) from a binary "1" (bubble presence).

SUMMARY OF THE INVENTION

The bubble memory system which accomplishes the foregoing objects comprises a bubble memory device having a detector which senses the presence or absence of a magnetic bubble in a bubble stream and which produces an output signal accordingly, with a sense amplifier coupled thereto to process the output signal and a means for dynamically offsetting the input to this sense amplifier thus enhancing the signal-to-noise factor at the input to clearly distinguish the signal representing the absence of a bubbles from the signal representing the presence of a bubble. In the embodiment disclosed, the detector is a bridge formed of magnetoresistive elements by which a bubble is detected by the change in resistance of one of the elements when a bubble is propagated thereunder and the sense amplifier responsive only to the positive going pulses, has a clamp circuit to select the voltage level with which the signal is to be compared at a sampling time and a strobe circuit for sampling the signal at the preselected time. The means for enhancing the signal-to-noise factor comprises means for applying a negative going pulse between the bridge detector output and the input to the sense amplifier. In one embodiment of this invention, the negative going pulse is applied inductively, and in another embodiment, this negative going pulse is applied capacitively.

BRIEF DESCRIPTIONS OF THE DRAWINGS

FIG. 1 illustrates a magnetic bubble detector arrangement where the bridge network is formed of two bubble memory chips coupled to a sense amplifier and wherein the dynamic offset or signal enhancement means comprises inductive coupling for dynamically shifting the level of the signal at the input to the sense amplifier;

FIG. 2 illustrates a typical prior out bubble signal without the means for enhancing the signal of this invention;

FIG. 3 is a cross-sectional view of a part of a printed circuit illustrating one practical embodiment of the conductor lines for inductively coupling the input lines to the sense amplifier as shown in FIG. 1;

FIG. 4 is a top view of the printed circuit illustrated in FIG. 3;

FIG. 5 shows the signal at the input to the sense amplifier utilizing the enhancement means of this invention, and FIG. 6 illustrates a dynamic shifting of the input to the sense amplifier utilizing capactivie coupling.

BRIEF DESCRIPTION OF THE PREFERRED EMBODIMENT

Turning now to FIG. 1, there is disclosed a bridge type magnetoresistive arrangement for the purpose of disclosing a detector 10 with which this invention may operate and which, for purpose of this illustration, are shown formed on two separate magnetic bubble memory chips A and B disposed on a printed circuit board 12. These chips are conventionally formed with suitable material on which conditions exist for establishing single wall domains and with magnetically soft propagate elements organized in patterns, such as storage loops and input and output gates and tracks, together with suitable bias sources, control circuits, and in-plane rotating magnetic fields for domain propagation. Each chip also has an active detector 14 and a dummy detector 16 formed of propagate elements, conventionally of the chevron type; the active detector 14 being in the bubble flow path while dummy detector 16 is utilized to balance the resistance of the active detector and to provide a noise signal approximately the same in amplitude, frequency and phases as the signal representing the absence of a bubble in the action leg of the detector.

Chip A is connected to voltage source VI and Chip B is connected to a voltage source V2 for the supply of current on the paths between voltage sources VI and V2. Also, each chip has its own rotating magnetic field for propagating domains and the propagate cycles in each chip will be selected to differ from the cycles of the other chip so that the legs of the bridge on Chips A and B act simply as resistances to balance the current flow while the presence or absence under a detector of one chip is being detected. Arrows 18 depict the bubble flow path formed of propagate elements simply to indicate that the dummy detector 2 is not in the bubble flow path. Resistances R1 and R2 are used to adjust the system to different voltages or different current requirements and capacitors C1 and C2 hold the bridge network free of dynamic signal related transients.

In this embodiment conductor lines 20 and 22 couple the bridge network directly to terminals 24 and 26 of a sense amplifier 28, such as Motorola MC 1544L/1444L or its equivalent. This sense amplifier 28 is provided with a clamp terminal, a strobe terminal and an output terminal where a pulse is sent according to the amplitude of the signal sampled by the amplifier, and, although not shown in this Figure, the amplifier actually has four pairs of inputs which can be digitally selected so that a single amplifier can service eight different bubble chips.

It should be understood also that the use of two chips, each containing an active and dummy detector, are for purposes of illustration since the legs of the bridge network of chip B, for example, could be replaced with balancing resistors, in which case, the amplifier would service only one chip; whereas in the illustrated embodiment a pair of inputs to the amplifier services two chips.

Thus far describing and taking, for example, the presence of a bubble under the active detector of Chip A, the operation of the system shown in FIG. 1 would produce an unbalance in the bridge network which would be sensed as a positive going pulse at the amplifier input terminals 24 and 26. In the operation of the amplifier, the circuitry is such that it responds to positive differential signals across the pair of input terminals and not to a negative signal across the same pair of input terminals; the selection of the inputs being as designated by the manufacturer (if the Motorola amplifier is used). Also, the amplifier contains a clamp circuit activated at the clamp terminal (capacitor restore) by which the voltage reference level, with which the signal is compared at strobe time, may be selected. As for example, there is a 40 or 50 millivolt offset signal present at the time the clamp terminal is activated, any later change such as a 1 millivolt signal, would be the signal to which the amplifier would respond. Another feature of the amplifier is the strobe circuitry also activated at the strobe terminal which allows the amplifier to be determined at a particular time after unclamping has occurred. Thus, turning now to FIG. 2, there is shown a typical prior art output signal 30 as a positiave pulse starting at clamp release point 32. This Figure also shows circuit noise as a positive going signal 34 and an intermediate signal region 36. If the noise level wave form peaks at near or within the intermediate region 36, it can be seen that it is difficult to determine whether the sensed signal is a binary "1" or a binary "0" signal; it being clear that signal noise and the absence of a bubble in the detector and a binary "0" signal are one and the same and that the peak of the pulse 34 represents the binary "0" output level. FIG. 1, which taken together with FIGS. 3 and 4, shows means for enhancing the signal at the input to the amplifier 28, and such means is indicated in its entirety as a 40 and comprises a conductor 42 connected to a suitable voltage supply source V3 and to a RL circuit 44 comprising resistor R3 and inductor L1 shunted across the diode D1. This RL circuit is, in turn, connected to the collector of an NPN transistor acting as a switch between the voltage source V3 and ground. It is to be noted, that the conductor 42 is shown in FIG. 1 as a planar partial loop formed of two legs 48 and 50 paralleling the conductor lines 20 and 22. This loop is more clearly shown in the FIGS. 3 and 4, where the conductor line 42 is shown below the conductors 20 and 22 but spaced therefrom, and both are sandwiched between a pair of spaced apart ground planes 52 formed of conductor material; all of which are spaced apart by suitable insulating material in the printed circuit board 10. The ground planes are removed from FIG. 4 for clarity.

Also shown in FIG. 1, are typical wave forms 54–60 with the voltage wave form 54 representative of the voltage being applied to the base of transistor 46 to turn transistor 46 on, and the current wave forms showing the various locations on the conductor line 42 and the result of the closing of switch (transistor 46 going ON), and the operation of the RL circuit ultimately forming the induced voltage wave form 60 representing the voltage applied to the conductor lines 20 and 22.

Turning now to FIG. 5, there is shown the clamp release point 32 to set the voltage reference level with which the signal 30 is to be compared, and the dynamic level shift pulse 60 (from FIG. 10 which occurred a short time after the clamp release time. It is to be noted, that the binary "1" signal at clamp release time had a faster rise time as shown at 30a then the binary "0" or the noise signal shown as 34a but both signals were shifted downwardly by the dynamic level shift pulse 60 and then both signals continued their positive rise. Note, in this case the peak of the binary "1" signal is still considerably above the detector indeterminate region 36 and the "0" signal is lowered considerably from the indeterminate region 36 or stated another way, by keeping the peak signal and noise levels spaced from the intermediate region 36, the danger of a misinterpretation of a binary "1" and a binary "0" signal has been lessened.

FIG. 6 is another illustration of the bridge type detector with an active and dummy detector legs with a means for dynamically shifting the voltage level of the signal to be sampled and for the purposes of illustration the same elements which perform the same function in this embodiment as in FIG. 1 are given the same reference numbers. In this embodiment, only one-half of the bridge circuit is shown with the other half being represented by a block diagram, but in this embodiment conductor line 42 terminates as an elongated conductor plate 62 which parallels only one of the conductors, such as 20. This conductor plate 62 is spaced slightly from the conductor 20 by a suitable insulating material to form a capacitor therewith which is charged by a negative going pulse 64 being applied through a suitable switching means, such as transistor 46 (not shown) of FIG. 1 connected to the terminal of the conductor line 42. Again, in this embodiment like the prior embodiments at clamp release time 32 the negative going pulse is applied to the terminal charging the capacitor formed by plate 62 and conductor 20 thus producing a negative going shift pulse 60 such as shown in FIG. 5 as previously described.

It should be mentioned that the implementation of the dynamic shift level of the invention shown in the printed circuit board could be feasibly formed in the bubble chip itself and finally, the same technique can be utilized when a flux pickup (dφ/dt) detector method is used instead of the magnetoresistive detectors in the illustrations.

What is claimed is:

1. In combination with a magnetic bubble device having structure for supporting bubbles thereon and elements disposed in an arrangement on which bubbles propagate serially as a stream in response to a rotating in-plane magnetic field,
    detector means for receiving said bubbles and for detecting the presence or absence of said bubbles in said stream and producing electrical signals having one amplitude for the absence of a bubble in said detector means and another amplitude for the presence of a bubble in said detector means,
    signal processing means including a sense amplifier for receiving said electrical signals and including means for establishing a reference voltage level as said signals are being received from which to compare at a later time the amplitudes of said signals from one detector means, and
    means for offsetting said electrical signals with respect to said reference voltage level before said amplitudes are compared to bring the peak value of the amplitude for the absence of a bubble signal closer to the reference voltage level when said amplitude is compared.

2. The combination as claimed in claim 1 wherein said means for offsetting said electrical signals is a signal applied to the input to said sense amplifier.

3. The combination as claimed in claim 1 wherein said electrical signals are positive going pulses and the reference voltage level is a level on said positive going pulses before said amplitudes reach their peak values and wherein the means for offsetting said electrical signals comprises lowering the positive going signals below said reference voltage after said reference voltage has been established but before said amplitudes have reached their peak values.

4. The combination as claimed in claim 3 further including a pair of conductors connecting the output of said detector means and the input of said sense amplifier and wherein said means for offsetting said electrical signals comprises circuit means for producing a negative going signal and conductor means paralleling said pair of conductors to induce said negative voltage into said pair of conductors.

5. The combination as claimed in claim 4 wherein said circuit means includes an RL network and a transistor switch for intermittently connecting said conductor means with a voltage source.

6. The combination as claimed in claim 3 further including a pair of conductors connecting the output of said detector means and the input of said sense amplifier and wherein said means for offsetting said electrical signals comprises circuit means for providing a negative going signal and includes a conductor disposed in parallel with one of said pair of conductors to form a capacitor coupling therewith.

7. The combination as claimed in claim 3 wherein said detector means comprises a bridge network of magnetoresistive elements having one leg of magnetoresistive elements located in the bubble stream so as to change resistance in the presence of a bubble being propagated thereunder, said bridge being connected to voltage source means so that said electrical signals are produced according to the change of resistance in said leg.

8. The combination as claimed in claim 3 wherein said detector means includes pairs of magnetoresistive elements electrically interconnected in a bridge configuration, one pair of said magnetoresistive elements being located in one magnetic bubble device and another pair of said magnetoresistive elements being located in another magnetic bubble device, one leg of each pair of magnetoresistive elements being located in the bubble stream so as to change resistance in the presence of a bubble being propagated thereunder, said detector means further being connected to voltage source means so that said electrical signals are produced accordingly to the change in resistance in said legs located in said bubble path.

* * * * *